(12) United States Patent
Duranton et al.

(10) Patent No.: US 8,452,827 B2
(45) Date of Patent: May 28, 2013

(54) DATA PROCESSING CIRCUIT

(75) Inventors: Marc Duranton, Veldhoven (FR); Laurent Pasquier, Asnieres-sur-Seine (FR); Valérie Rivierre, Vincennes (FR); Qin Zhao, Charenton le Pont (FR)

(73) Assignee: Entropic Communications, Inc., San Diego, CA (US)

( * ) Notice: Subject to any disclaimer, the term of this patent is extended or adjusted under 35 U.S.C. 154(b) by 1933 days.

(21) Appl. No.: 10/522,463

(22) PCT Filed: Jul. 9, 2003

(86) PCT No.: PCT/IB03/03061
§ 371 (c)(1),
(2), (4) Date: Jan. 26, 2005

(87) PCT Pub. No.: WO2004/013963
PCT Pub. Date: Feb. 12, 2004

(65) Prior Publication Data
US 2006/0036665 A1 Feb. 16, 2006

(30) Foreign Application Priority Data
Jul. 31, 2002 (FR) ..................... 02 09745

(51) Int. Cl.
*G06F 17/10* (2006.01)
(52) U.S. Cl.
USPC ......................................... 708/319
(58) Field of Classification Search
USPC ......................................... 708/319
See application file for complete search history.

(56) References Cited

U.S. PATENT DOCUMENTS

| | | | |
|---|---|---|---|
| 4,592,027 A | 5/1986 | Masaki | |
| 4,785,411 A | 11/1988 | Thompson et al. | |
| 4,864,574 A | 9/1989 | Pritt | |
| 4,928,265 A | 5/1990 | Higuchi et al. | |
| 4,953,130 A | 8/1990 | Houston | |
| 4,954,992 A | 9/1990 | Kumanoya et al. | |
| 4,975,877 A | 12/1990 | Bell | |
| 5,027,325 A | 6/1991 | Katsura | |
| 5,031,150 A | 7/1991 | Ohsawa | |
| 5,077,690 A | 12/1991 | Smith | |
| 5,383,145 A | 1/1995 | Sakiyama et al. | |
| 5,383,155 A | 1/1995 | Ta | |
| 6,308,191 B1 * | 10/2001 | Dujardin et al. | 708/319 |
| 6,889,238 B2 * | 5/2005 | Johnson | 708/313 |
| 6,963,890 B2 * | 11/2005 | Dutta et al. | 708/319 |
| 2001/0007573 A1 | 7/2001 | Kingston et al. | |

FOREIGN PATENT DOCUMENTS
EP 0942530 A 9/1999

OTHER PUBLICATIONS

Ouelette et al.: "BICMOS SRAM with Array-Integrated Sense Device", IBM Burlington Technical Disclosure, pp. 1-3, May 1991.

* cited by examiner

*Primary Examiner* — David H Malzahn
(74) *Attorney, Agent, or Firm* — Bruce Greenhaus; Richard Bachand; Duane Morris LLP

(57) ABSTRACT

The invention relates to a data processing system for performing a polyphase filtering. This circuit comprises functional units (304, 305, 306) able to perform polyphase filterings, and a memory device (301, 302, 308) for storing data and coefficients. The functional units receive in parallel data and coefficients coming from the memory device, calculate results from the data and coefficients and supply these results to the memory device.

7 Claims, 6 Drawing Sheets

DATA PROCESSING CIRCUIT

FIELD OF THE INVENTION

The present invention relates to a data processing circuit comprising at least a first functional unit able to perform a n-taps polyphase filtering and a second filtering unit able to perform a m-taps polyphase filtering, m and n being integers greater than or equal to two, as well as a memory device able to store data and coefficients.

The invention finds an application, for example, in an image processing system, in particular in a real-time system.

BACKGROUND OF THE INVENTION

Some image processing systems use polyphase filters. For example, when video data are broadcast in a high-definition format, it is necessary to convert them into a standard format in order to be able to display them on a television whose screen is not compatible with the high-definition format. A polyphase filter in particular makes it possible to perform such a conversion with good quality.

United States patent U.S. Pat. No. 5,383,155 granted on 17 Jan. 1995 describes several embodiments of polyphase filters. In one of the embodiments, the polyphase filter described is a 64-taps polyphase filter consisting of eight 8-taps polyphase filters placed in series.

FIG. 1 illustrates an 8-taps polyphase filter as described in this patent. This filter comprises registers 101 and 108 and 111 to 118, multipliers for multiplying by coefficients c1 to c8 and an adder 120. This filter functions in direct mode.

Data are received in series one after another by the filter. These data correspond for example to pixel values P1 to P8 of an input image. In addition, a clock controls the registers. At each clock cycle, a data item is received at the register 101. When a data item arrives at the register 101, the data item situated in the register 101 shifts towards the register 102, the data item situated in the register 102 shifts towards the register 103 and so on. Thus, after eight clock cycles, the pixel value P8 is situated in the register 101, the pixel value P7 in the register 102 and so on. The multipliers then calculate values c8*P8, c7*P7 and so on. The adder 120 next calculates a result S:

$$S=c1*P1+c2*P2+c3*P3+c4*P4+c5*P5+c6*P6+c7*P7+c8*P8.$$

FIG. 2 illustrates a 64-taps polyphase filter as described in U.S. Pat. No. 5,383,155. This filter comprises eight 8-taps polyphase filters 201 to 208, as described in FIG. 1, as well as eight registers 211 to 218. These filters are placed in series, each filter sending to the following filter data to be processed and the results which it has calculated. Assume that the filter in FIG. 1 is the filter 202 in FIG. 2. The adder 120 has an input S(−1) which receives the result calculated by the filter 201 at the previous clock cycle, from eight data items. Thus the filter 202 calculates a result from sixteen data items, the filter 203 from twenty-four data items and so on. The filter 208 therefore calculate a result from sixty-four data items. The registers 211 to 217 serve to ensure that the filters 201 to 208 are correctly put in series.

A drawback of such a filter lies in the fact that it carries out only a polyphase filtering with a fixed number of taps. This is because, once the filters 201 to 208 in FIG. 2 are placed in series, it is no longer possible to carry out a 50-taps polyphase filtering for example.

However, current video processing systems require various types of polyphase filtering, in particular because of the large number of image formats used in television. Consequently, if it is wished to use the teachings of the patent cited above, it is necessary to provide in this circuit as many polyphase filters as there are types of polyphase filtering required. Such a solution has many drawbacks, in particular because these circuits occupy a large surface area of silicon in the circuit.

SUMMARY OF THE INVENTION

It is an object of the invention to propose a processing circuit occupying a small surface area and making it possible to perform various types of polyphase filtering.

A processing circuit according to the invention as defined in the opening paragraph is characterized in that the functional units are able to receive in parallel data and coefficients coming from the memory device, calculate results from said data and coefficients and supply these results to the memory device.

According to the invention, the data to be processed by a functional unit are directly sent by the memory device. The functional units communicate by means of the memory device. Thus the functional units are not physically connected to each other, which makes it possible to perform various types of polyphase filtering, by suitably programming the processing circuit.

For example, the processing circuit can comprise ten functional units, each being able to perform a 2-taps polyphase filtering. In this case, it is possible, as will be seen in more detail below, to perform a 2-taps polyphase filtering, a 4-taps polyphase filtering and so on up to a 20-taps polyphase filtering. For example, for a 10-taps polyphase filtering, five functional units calculate intermediate results from two data items and these intermediate results, sent to the memory device, are then added in order to obtain a final result.

Advantageously, at least one functional unit is able to function according to a direct mode and a transposed mode, the circuit comprising control means for controlling the functioning mode of said functional unit.

This makes it possible, with the same processing circuit, to perform a polyphase filtering in direct or transposed mode, which increases the number of types of polyphase filtering which can be performed by this processing circuit, without considerably increasing the surface area of this circuit.

Preferably, at least one functional unit is also able to perform a multiplication-accumulation using two data items coming from the memory device. This increases still further the processing capabilities of such a circuit.

The processing circuit can simultaneously perform a polyphase filtering and one or more multiplication-accumulation operations. This is possible because of the great flexibility of this circuit. This is because, the data being sent to the functional units by the memory device, each functional unit is independent of the others; consequently the functional units can perform tasks which are different from each other.

Advantageously, the processing circuit comprises a crossbar able to provide a transfer of data, coefficients and results between the memory device and at least one functional unit.

Such a crossbar ensures rapid communications in parallel of data between the memory device and the functional units, as well as good management of such communications.

BRIEF DESCRIPTION OF THE DRAWINGS

The invention will be further described with reference to examples of embodiments shown in the drawings to which, however, the invention is not restricted.

FIGS. 4a and 4b depict input and output image pixels for filtering in direct mode and transposed mode.

DESCRIPTION OF PREFERRED EMBODIMENTS

Figure 1:
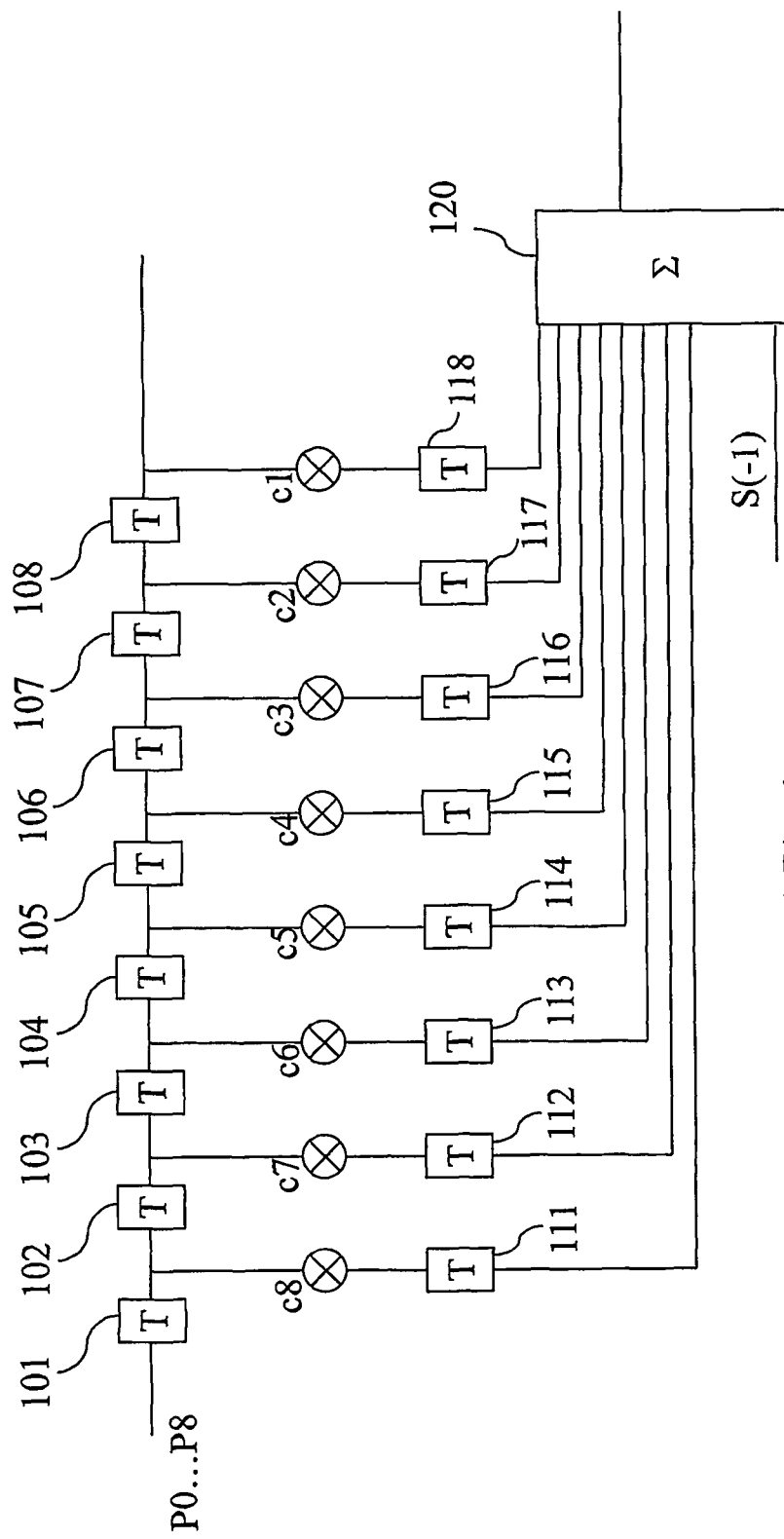
FIG. 1 depicts an 8-taps polyphase filter according to the prior art.
Figure 2:
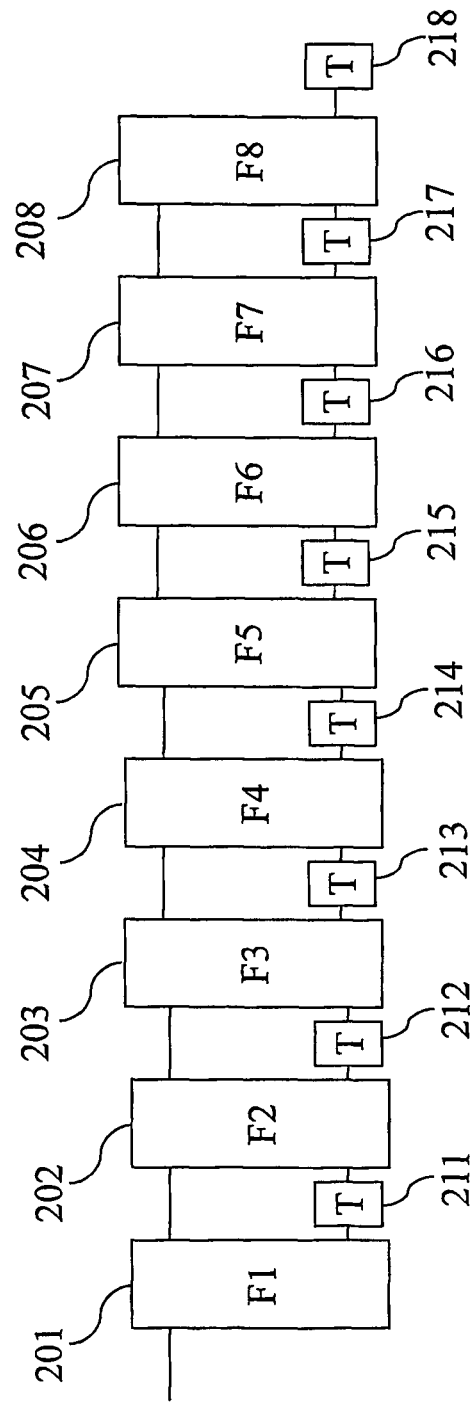
FIG. 2 depicts a 64-taps polyphase filter according to the prior art, using the filters of FIG. 1.
Figure 3:
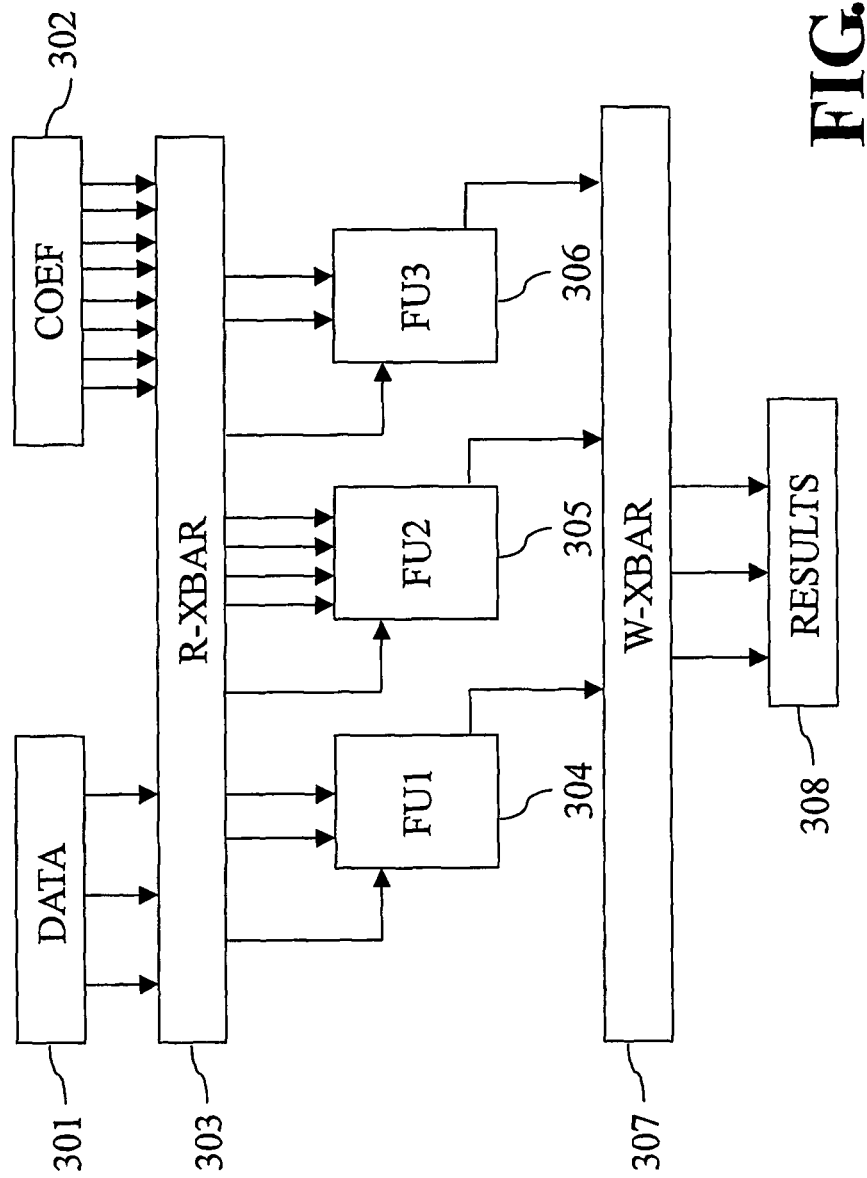
FIG. 3 depicts a processing circuit according to the invention.

FIG. 3 depicts a processing circuit according to the invention. Such a circuit comprises a data storage device 301, a coefficient storage device 302, a reading crossbar 303, a first functional unit 304, a second functional unit 305, a third functional unit 306, a writing crossbar 307 and a result storage device 308.

The data storage device 301, the coefficient storage device 302 and the result storage device 308 form a memory device. The reading crossbar 303 and the writing crossbar 307 form a crossbar.

The memory device can comprise a single physical entity, for example a register bank able to store data, coefficients and results. The crossbar can also consist of a single physical entity.

The first functional unit 304 is able to perform a 2-taps polyphase filtering, the second functional unit 305 a 4-taps polyphase filtering and the third functional unit 306 a 2-taps polyphase filtering. A functional unit can receive in one clock cycle a data item coming from the data storage device 301. This data item corresponds for example to a pixel value of an input image, for example a chrominance value.

Assume that it is wished to perform, with the processing circuit of FIG. 3, a 4-taps polyphase filtering.

A first solution comprises using solely the second functional unit 305. The data to be processed and the coefficients are sent to this functional unit, which processes them in the same way as in the prior art and supplies results which correspond for example to pixel values of an output image. The reading crossbar 303 comprises multiplexers controlled by a control system, not shown in FIG. 3. This reading crossbar 303 orients the data and coefficients coming from the memory device to the second functional unit 305.

Figures 4A, 4B:
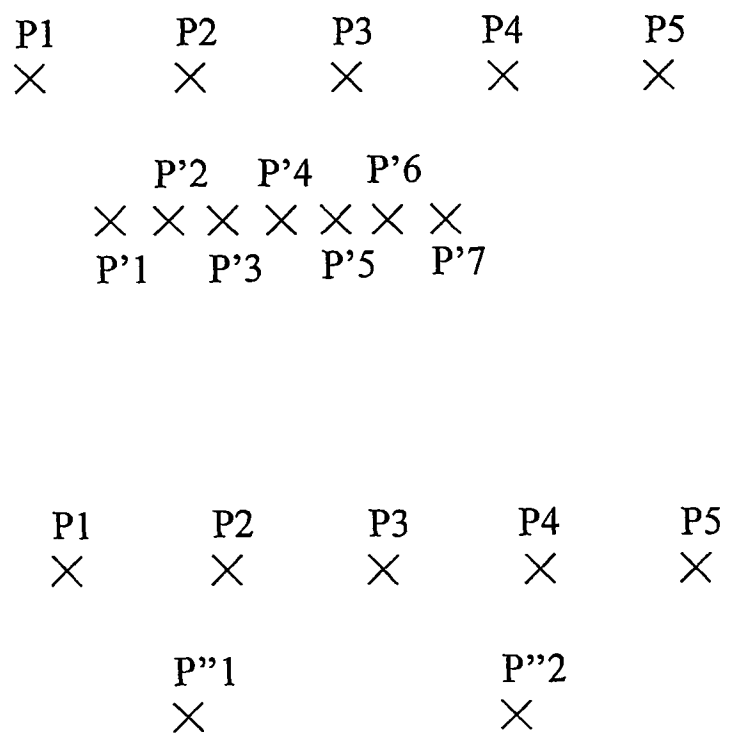

A second solution consists of using the first functional unit 304 and the third functional unit 306. Assume, as indicated in FIG. 4a, that there are five pixel values P1 to P5 of an input image and that it is wished to calculate seven pixel values P'1 to P'7 of an output image, using coefficients $c_{11}$ to $c_{14}$, $c_{21}$ to $c_{24}$ and so on, and using a direct polyphase filtering, the values P'1 to P'7 being defined as follows:

$$P'1=c_{11}*P1+c_{12}*P2+c_{13}*P3+c_{14}*P4$$

$$P'2=c_{21}*P1+c_{22}*P2+c_{23}*P3+c_{24}*P4$$

$$P'3=c_{31}*P1+c_{32}*P2+c_{33}*P3+c_{34}*P4$$

$$P'4=c_{41}*P1+c_{42}*P2+c_{43}*P3+c_{44}*P4$$

$$P'5=c_{51}*P1+c_{52}*P2+c_{53}*P3+c_{54}*P4$$

$$P'6=c_{61}*P1+c_{62}*P2+c_{63}*P3+c_{64}*P4$$

$$P'7=c_{71}*P2+c_{72}*P3+c_{73}*P4+c_{74}*P5$$

During a first clock cycle, the value P1 is sent to the first functional unit 304 able to perform a direct 2-taps polyphase filtering, the value P3 is sent to the third functional unit 306 able to perform a direct 2-taps polyphase filtering, the coefficients $c_{11}$ and $c_{12}$ are sent to the first functional unit 304 and the coefficients $c_{13}$ and $c_{14}$ are sent to the third functional unit 306. During a second clock cycle, the value P2 is sent to the first functional unit 304 and the value P4 is sent to the third functional unit 306.

The first functional unit 304 then calculates a first intermediate result $c_{11}*P1+c_{12}*P2$ and the third functional unit 306 calculates a second intermediate result $c_{13}*P3+c_{14}*P4$. These intermediate results are sent to the result storage device 308 by means of the writing crossbar 307. Once stored in the memory device, these intermediate results can subsequently be added in order to obtain the value P'1, by means of an adder, not shown in FIG. 3.

At the next clock cycle, the coefficients $c_{21}$ and $c_{22}$ are sent to the first functional unit 304 and the coefficients $c_{23}$ and $c_{24}$ are sent to the third functional unit 306. The first functional unit 304 then calculates an intermediate result $c_{21}*P1+c_{22}*P2$ and the third functional unit 306 calculates another intermediate result $c_{23}*P3+c_{24}*P4$. These intermediate results are sent to the result storage device 308 by means of the writing crossbar 307.

The same procedure is followed for calculating the values P'3 to P'6.

At the clock cycle following the calculation of $c_{61}*P1+c_{62}*P2$ and $c_{63}*P3+c_{64}*P4$, the value P3 is sent to the first functional unit 304, the value P5 is sent to the third functional unit 306, the coefficients $C_{71}$ and $c_{72}$ are sent to the first functional unit 304 and the coefficients $C_{73}$ and $C_{74}$ are sent to the third functional unit 306. The first functional unit 304 then calculates an intermediate result $c_{71}*P2+c_{72}*P3$ and the third functional unit 306 calculates another intermediate result $c_{73}*P4+c_{74}*P5$. These intermediate results are sent to the result storage device 308 by means of the writing crossbar 307.

If it is wished to perform a 6-taps polyphase filtering with the processing circuit of FIG. 3, it is possible either to use the first functional unit 304 and the second functional unit 305, or the second functional unit 305 and the third functional unit 306.

If it is wished to perform an 8-taps polyphase filtering, the three functional units 304 to 306 are used.

The processing circuit of FIG. 3 also makes it possible to perform in parallel a 2-taps polyphase filtering and a 6-taps polyphase filtering, or two parallel 4-taps polyphase filterings.

Consequently the processing circuit according to the invention makes it possible to perform several types of polyphase filtering, requiring a surface area comparable with that required in the prior art. This is because the functional units, as will be seen in more detail in FIG. 4, are comparable to those used in the prior art in terms of surface area.

The example described above applies to a direct polyphase filtering. It is possible, with the processing circuit according to the invention, to perform a transposed polyphase filtering if functional units able to perform a transposed polyphase filtering are available.

Assume, as indicated in FIG. 4b, that there are five pixel values P1 to P5 of an input image and that it is wished to calculate two pixel values P"1 and P"2 of an output image, using coefficients $c_{11}$ to $C_{14}$ and $c_{21}$ to $c_{24}$, and using a transposed polyphase filtering, the values P"1 to P"2 being defined as follows:

$$P''1=c_{11}*P1+c_{12}*P2+c_{13}*P3+c_{14}*P4$$

$$P''2=c_{21}*P2+c_{22}*P3+c_{23}*P4+c_{24}*P5$$

During a first clock cycle, the value P1 is sent to the first functional unit 304 able to perform a transposed 2-taps polyphase filtering, the value P3 is sent to the third functional unit 306 able to perform a transposed 2-taps polyphase filtering, the coefficients $c_{11}$ and 0 are sent to the first functional unit 304 and the coefficients $c_{13}$ and 0 are sent to the third functional unit 306. The value $c_{11}*P1$ is then calculated and stored in a register of the first functional unit 304. In the same way, the value $c_{13}*P3$ is calculated and stored in a register of the third functional unit 306.

During a second clock cycle, the value P2 is sent to the first functional unit 304, the value P4 is sent to the third functional unit 306, the coefficients $c_{21}$ and $c_{12}$ are sent to the first functional unit 304 and the coefficients $c_{23}$ and $c_{14}$ are sent to the third functional unit 306. The first functional unit 304 then calculates the value $c_{11}*P1+c_{12}*P2$ and the third functional unit 306 calculates the value $c_{13}*P3+c_{14}*P4$. These values are sent to the result storage device 308.

During a third clock cycle, the value P3 is sent to the first functional unit 304, the value P5 is sent to the third functional unit 306, the coefficients 0 and $c_{22}$ are sent to the first functional unit 304 and the coefficients 0 and $c_{24}$ are sent to the third functional unit 306. The first functional unit 304 then calculates the value $c_{21}*P2+c_{22}*P3$ and the third functional unit 306 calculates the value $c_{23}*P4+c_{24}*P5$. These values are sent to the result storage device 308.

It can thus be seen that the processing circuit according to the invention makes it possible to reduce the time required by an initialization of the filtering. This is because, in order to perform a transposed polyphase filtering using five pixel values, as indicated in FIG. 4b, the processing circuits of the prior art require five clock cycles whilst the circuit according to the invention requires only three clock cycles for initializing this filtering.

Figure 5:
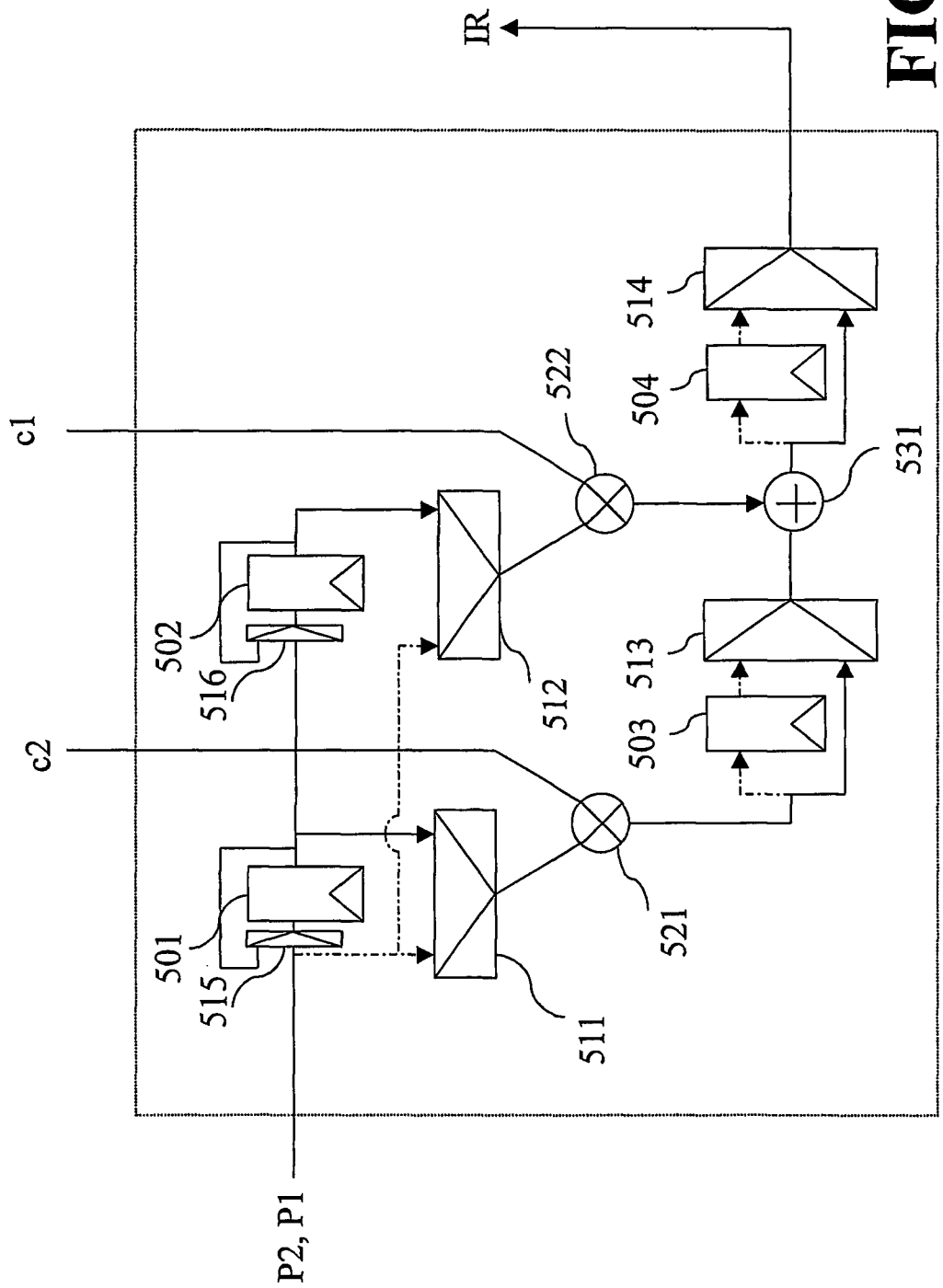
FIG. 5 depicts a functional unit which can be used in the processing circuit of FIG. 3.

FIG. 5 depicts a functional unit which can be used in the processing circuit according to the invention, for example the first functional unit 304. This functional unit comprises four registers 501 to 504, six multiplexers 511 to 516, two multipliers 521 and 522 and an adder 531.

This functional unit can function according to a direct mode and a transposed mode. When the functional unit functions in direct mode, the multiplexers 511 to 514, controlled by a control circuit, not shown in FIG. 4, select the data which have followed a path shown in solid lines. When the functional unit functions in transposed mode, the multiplexers 511 to 514 select the data which have followed a path shown in dotted lines.

Take the example detailed in the description of FIG. 3, when the first functional unit 304 and the third functional unit 306 are used for performing a direct 4-taps polyphase filtering. At the first clock cycle, the value P1 is sent into the register 501, the value $c_{12}$ is sent to the multiplier 521 and the coefficient $c_{11}$ is sent to the multiplier 522. At the second clock cycle, the value P2 is sent into the register 501. The value P1 is then sent into the register 502. This is because the registers are designed so that, at each clock cycle, the data item present in a register leaves this register. The multiplier 521 then calculates the value $c_{12}*P2$ and the multiplier 522 the value $c_{11}*P1$. The adder 531 then calculates the value $c_{12}*P2+c_{11}*P1$, which is then sent to the result storage device 308.

At the following clock cycle, the coefficients $c_{11}$ and $c_{12}$ are replaced by the coefficients $c_{21}$ and $c_{22}$. The value P2 is reinjected into the register 501 by means of the multiplexer 515. Likewise, the value P1 is reinjected into the register 502 by means of the multiplexer 516. The functional unit then calculates the value $c_{22}*P2+c_{21}*P1$. The same procedure is followed for calculating P'3 to P'6.

When, for calculating P'7, the value P3 is sent into the register 501, the value P2 is sent into the register 502. The multipliers 521 and 522 then calculate the values $c_{72}*P3$ and $c_{71}*P2$ and the adder 531 calculates the value $c_{71}*P2+c_{72}*P3$, which is sent to the result storage device 308.

Take the example detailed in the description of FIG. 3, when the first functional unit 304 and the third functional unit 306 are used for performing a transposed 4-taps polyphase filtering.

At the first clock cycle, the value P1 is sent to the multipliers 521 and 522, the coefficient $c_{11}$ is sent to the multiplier 521 and a zero coefficient is sent to the multiplier 522. The value $c_{11}*P1$ is then calculated and stored in the register 503.

At the second clock cycle, the value P2 is sent to the multipliers 521 and 522, the coefficient $c_{21}$ is sent to the multiplier 521 and the coefficient $c_{12}$ is sent to the multiplier 522. The value $c_{21}*P2$ is then calculated and stored in the register 503, whilst the adder 531 calculates the value $c_{11}*P1+c_{12}*P2$, which is stored in the register 504 and will be sent to the result storage device 308 at the third clock cycle.

At the third clock cycle, the value P3 is sent to the multipliers 521 and 522, the coefficient $c_{21}$ is sent to the multiplier 522 and a zero coefficient is sent to the multiplier 521. The value $c_{22}*P3+c_{21}*P2$ is then calculated and stored in the register 504 and will be sent to the result storage device 308 at the following clock cycle.

Figure 6:
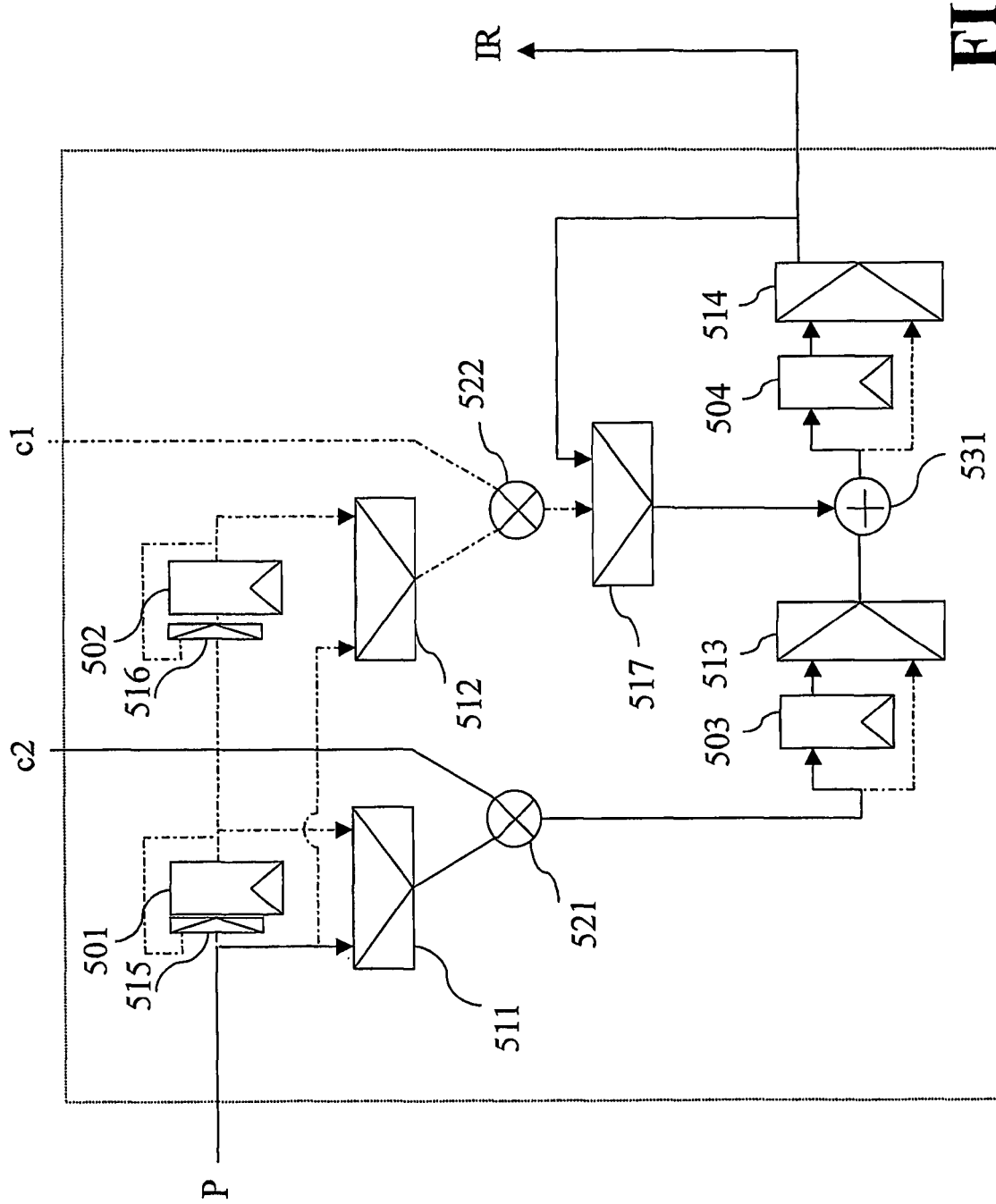
FIG. 6 depicts another functional unit which can be used in the processing circuit of FIG. 3.

FIG. 6 depicts another functional unit which can be used in the processing circuit according to the invention. A functional unit of this type comprises, in addition to the elements already cited in the description of FIG. 5, an additional multiplexer 517. This functional unit is able to perform, in addition to a direct 2-taps polyphase filtering and a transposed 2-taps polyphase filtering, a multiplication-accumulation of data stored in the data storage device 301 of FIG. 3.

When this functional unit has to perform a multiplication-accumulation, the multiplexers 511 to 514, controlled by a control circuit, not shown in FIG. 6, select the data which have followed a path denoted in solid lines. The input denoted c2, which receives a coefficient when the functional unit performs a polyphase filtering, receives here a data item stored in the data storage device 301. This is possible by virtue of the reading crossbar 303, which makes it possible to send a data item from the data storage device 301 to any input of the functional unit.

Assume for example that it is wished to calculate, from four data P1 to P4, a value P1*P2+P3*P4. During a first clock cycle, the data item P1 is sent to the input denoted P and the data item P2 to the input denoted c2. The value P1*P2 is then calculated by the multiplier 521 and stored in the register 503. During a second clock cycle, the value P1P2 is sent to the register 504, the data item P3 is sent to the input denoted P and the data item P4 to the input denoted c2. The value P3*P4 is then calculated by the multiplier 521 and stored in the register 503. During a third clock cycle, the adder 531 performs the addition between the values P1*P2 and P3*P4, the result of this addition then being stored in the register 504 and being able to be sent to the result storage device 308 at the following clock cycle.

A multiplication-accumulation of this type is used for example for performing a multiplication of matrices or a convolutional filtering.

A functional unit of this type is able to perform various types of filtering. When a functional unit of this type is integrated in a circuit according to the invention, it can therefore perform various processings, independently of the other functional units. For example, assuming that the functional units 304 to 306 of FIG. 3 are of the type depicted in FIG. 6, it is possible to perform simultaneously, with the processing circuit of FIG. 3, a 6-taps polyphase filtering and a multiplication-accumulation, or a direct 4-taps polyphase filtering and a transposed 4-taps polyphase filtering, or a direct 2-taps polyphase filtering, a transposed 4-taps polyphase filtering and a multiplication-accumulation.

Naturally, because of the great flexibility of the processing circuit according to the invention, a large number of simultaneous processings can be conceived of, according to the number and type of functional units.

A circuit like the one depicted in FIG. 3 can be used in an image processing system, intended to calculate pixel values in order to display these pixels on a screen. An image processing system of this type can be incorporated, for example, in a decoder, a receiver decoder device for television, a television, a central computer unit or a computer screen. An image processing system of this type can be used in a communication network comprising at least one transmitter able to send signals representing at least one image, a transmission network, and a receiver able to receive said signals.

The verb "to comprise" and its conjugations should be interpreted broadly, that is to say as not excluding the presence not only of elements other than those listed after the said verb but also a plurality of elements already listed after said verb and preceded by the article "a" or "one".

The invention claimed is:

1. A data processing circuit comprising:
   a memory device to store data and coefficients;
   at least a first functional unit to perform a n-taps polyphase filtering and a second functional unit to perform a m-taps polyphase filtering, m and n being integers greater than or equal to two, wherein the functional units are able to receive in parallel during at least one common clock cycle data and coefficients coming from the memory device, and to calculate results from said data and coefficients and supply these results back to the memory device;
   a crossbar to perform a transfer of the data, coefficients, and results between the memory device and any functional unit or any combination of functional units; and
   an adder to add one or more results from the first functional unit with one or more results from the second functional unit.

2. A data processing circuit as claimed in claim 1, wherein at least one functional unit is able to function according to a direct mode and a transposed mode, the circuit comprising control means for controlling the functioning mode of said functional unit.

3. A data processing circuit as claimed in claim 1, wherein at least one functional unit is also able to perform a multiplication-accumulation using two data items coming from the memory device.

4. An image processing system comprising a processing circuit as claimed in claim 1.

5. A receiver decoder device for television comprising at least one image processing system as claimed in claim 4.

6. A device comprising at least one screen intended to display images and an image processing system as claimed in claim 4.

7. A communication network comprising at least one transmitter able to send signals representing at least one image, a transmission network, a receiver able to receive said signals and an image processing system as claimed in claim 4.

* * * * *